(12) United States Patent
Arfaei Malekzadeh et al.

(10) Patent No.: US 11,374,610 B2
(45) Date of Patent: *Jun. 28, 2022

(54) RADIO FRONT END MODULE WITH REDUCED LOSS AND INCREASED LINEARITY

(71) Applicant: SKYWORKS SOLUTIONS, INC., Irvine, CA (US)

(72) Inventors: Foad Arfaei Malekzadeh, Irvine, CA (US); Sanjeev Jain, Ottawa (CA); Stephen Joseph Kovacic, Newport Beach, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/236,272

(22) Filed: Apr. 21, 2021

(65) Prior Publication Data
US 2021/0242897 A1     Aug. 5, 2021

Related U.S. Application Data

(63) Continuation of application No. 16/695,440, filed on Nov. 26, 2019, now Pat. No. 11,018,714.
(Continued)

(51) Int. Cl.
*H04B 1/40*     (2015.01)
*H03F 3/213*    (2006.01)
(Continued)

(52) U.S. Cl.
CPC ............. *H04B 1/40* (2013.01); *H03F 1/3211* (2013.01); *H03F 1/56* (2013.01); *H03F 3/213* (2013.01);
(Continued)

(58) Field of Classification Search
CPC ... H04B 1/40; H03F 3/213; H03F 3/68; H03F 1/56; H03F 3/45071; H03F 1/3211;
(Continued)

(56) References Cited

U.S. PATENT DOCUMENTS 8,271,028 B2   9/2012   Rabjohn
8,610,504 B2   12/2013  Rabjohn
(Continued)

*Primary Examiner* — Lewis G West
(74) *Attorney, Agent, or Firm* — Lando & Anastasi, LLP

(57) ABSTRACT

A Radio Frequency (RF) circuit including a receive path, a transmit path, a switching circuit, and an output configured to receive RF signals from an antenna in a receive mode of operation, and to provide RF signals to the antenna in a transmit mode of operation. The receive path is configured to be coupled between a low-noise amplifier and the output. The switching circuit is located in the receive path and is configured, in the receive mode, to selectively couple the low-noise amplifier to the output and to pass the received RF signals from the output to the low-noise amplifier. The transmit path is configured to be coupled between a power amplifier and the output, to provide, in the transmit mode, signals from the power amplifier to the output, bypassing the switching circuit, and to have, in receive mode of operation, an off-state impedance of at least 200+j*13 Ohm.

22 Claims, 7 Drawing Sheets

Related U.S. Application Data

(60) Provisional application No. 62/771,676, filed on Nov. 27, 2018.

(51) Int. Cl.
*H03F 3/68* (2006.01)
*H03F 1/56* (2006.01)
*H03F 3/45* (2006.01)
*H03F 1/32* (2006.01)

(52) U.S. Cl.
CPC .......... *H03F 3/45071* (2013.01); *H03F 3/68* (2013.01); *H03F 2200/06* (2013.01); *H03F 2200/09* (2013.01); *H03F 2200/192* (2013.01); *H03F 2200/204* (2013.01); *H03F 2200/222* (2013.01); *H03F 2200/294* (2013.01); *H03F 2200/451* (2013.01)

(58) Field of Classification Search
CPC .......... H03F 2200/09; H03F 2200/294; H03F 2200/222; H03F 2200/06; H03F 2200/192; H03F 2200/204; H03F 2200/451
See application file for complete search history.

(56) References Cited

U.S. PATENT DOCUMENTS

| | | | |
|---|---|---|---|
| 9,083,289 B2 | 7/2015 | Rabjohn | |
| 10,116,347 B1* | 10/2018 | Xu | H03F 3/72 |
| 10,566,946 B2 | 2/2020 | Gorbachov | |
| 2008/0299913 A1* | 12/2008 | Han | H04B 1/48 |
| | | | 455/83 |
| 2010/0109798 A1* | 5/2010 | Chu | H03H 7/38 |
| | | | 333/124 |
| 2013/0035048 A1* | 2/2013 | Chee | H04B 1/48 |
| | | | 455/83 |
| 2015/0333791 A1* | 11/2015 | Anderson | H04B 1/48 |
| | | | 455/83 |
| 2018/0145648 A1* | 5/2018 | Ye | H03F 3/72 |
| 2018/0262229 A1* | 9/2018 | Pusl, III | H04B 1/40 |
| 2019/0081651 A1* | 3/2019 | Watanabe | H04B 1/18 |
| 2019/0158066 A1* | 5/2019 | Ju | H03K 17/04106 |
| 2020/0169285 A1 | 5/2020 | Arfaei Malekzadeh et al. | |

* cited by examiner

RADIO FRONT END MODULE WITH REDUCED LOSS AND INCREASED LINEARITY

CROSS-REFERENCE TO RELATED APPLICATIONS

This application claims priority under 35 U.S.C. § 120 as a continuation of U.S. patent application Ser. No. 16/695,440 titled "RADIO FRONT END MODULE WITH REDUCED LOSS AND INCREASED LINEARITY," filed Nov. 26, 2019, which claims priority under 35 U.S.C. § 119(e) to U.S. Provisional Patent Application Ser. No. 62/771,676 titled "RADIO FRONT END MODULE WITH REDUCED LOSS AND INCREASED LINEARITY," filed Nov. 27, 2018, each of which is incorporated herein by reference in its entirety for all purposes.

BACKGROUND

FIG. 1 is a block diagram illustrating an example of a typical arrangement of a Radio-Frequency (RF) "front-end" sub-system or module (FEM) 100 as may be used in a communications device, such as a mobile phone, for example, to transmit and receive RF signals. The FEM 100 shown in FIG. 1 includes a transmit path (TX) configured to provide signals to an antenna for transmission and a receive path (RX) to receive signals from the antenna. In the transmit path (TX), a power amplifier module 110 provides gain to an RF signal 105 input to the FEM 100 via an input port 101, producing an amplified RF signal. The power amplifier module 110 can include one or more Power Amplifiers (PA). The FEM 100 can further include a filtering sub-subsystem or module 120, which can include one or more filters. A directional coupler 130 can also be used to extract a portion of the power from the RF signal traveling between the power amplifier module 110 and an antenna 140 connected to the FEM 100. The antenna 140 can transmit the RF signal and can also receive RF signals. A switching circuit 150, also referred to as an Antenna Switch Module (ASM), can be used to switch between a transmitting mode and receiving mode of the FEM 100, for example, or between different transmit or receive frequency bands. The switching circuit 150 can be operated under the control of a controller 160. The FEM 100 can also include a receive path (RX) configured to process signals received by the antenna 140 and provide the received signals to a signal processor (e.g., a transceiver) via an output port 171. The receive path (RX) can include one or more Low-Noise Amplifiers (LNA) 170 to amplify the signals received from the antenna. Although not shown, the receive path (RX) can also include one or more filters for filtering the received signals.

As Complementary Metal-Oxide-Semiconductor technology (CMOS) is scaled down and adopted for many RF and millimeter-wave radio systems, the design of Transmit/Receive (T/R) switches in CMOS (e.g., in the switching circuit 150) has received considerable attention. For example, T/R switches designed in 0.5 mm-28 nm CMOS processes have been developed and some have become candidates for Wireless Local Area Network (WLAN) and Ultra-Wideband (UWB) radios. However, such switches typically do not meet the requirements of mobile cellular 5G (e.g., 6-GHz to 100-GHz) and Wireless Personal Area Network (WPAN) 60-GHz radios.

SUMMARY

A new switching circuit is described herein that reduces switching losses in the transmit path to the antenna by removing the switch from the transmit path.

At least one aspect of the invention is directed to a front-end module for a wireless device comprising an input port to receive an input radio frequency signal, a power amplifier coupled to the input port to amplify the input radio frequency signal and provide a first radio frequency signal responsive to being enabled, and to present an off-state impedance of at least 200 Ohms responsive to being disabled, an antenna port configured to be coupled to an antenna, to receive a second radio frequency signal from the antenna in a receive mode of operation and to transmit the first radio frequency signal from the power amplifier to the antenna in a transmit mode of operation, a low-noise amplifier coupled to the antenna port to amplify the second radio frequency signal and provide the amplified second radio frequency signal to an output port, a switching circuit disposed between the low-noise amplifier and the antenna port to selectively couple the low-noise amplifier to the antenna port, and a controller coupled to the switching circuit, the power amplifier, and the low-noise amplifier. The controller is configured to cause the switching circuit to close and to disable the power amplifier in the receive mode of operation, and to cause the switching circuit to open in the transmit mode of operation.

In some embodiments, the controller is further configured, in the receive mode of operation, to transmit an enable control signal to the low-noise amplifier and a disable control signal to the power amplifier.

In some embodiments, the controller is further configured, in the transmit mode of operation, to transmit an enable control signal to the power amplifier and a disable control signal to the low-noise amplifier.

In some embodiments, the controller is further configured, in the transmit mode of operation, to transmit an enable control signal to the power amplifier in response to the switching circuit opening and to transmit a disable control signal to the low-noise amplifier in response to the power amplifier being enabled.

In some embodiments, the controller is further configured, in the receive mode of operation, to transmit a disable control signal to the power amplifier, cause the switching circuit to close in response to the power amplifier being disabled, and transmit an enable control signal to the low-noise amplifier in response to the switching circuit closing.

In some embodiments, the low-noise amplifier includes a differential amplifier, a first balun coupled between the differential amplifier and the switching circuit, and a second balun coupled between the differential amplifier and the output port.

In some embodiments, the input radio frequency signal has a frequency in a 34-36 GHz range and the power amplifier is further configured to amplify the input RF signal having a frequency in the 34-36 GHz range.

In some embodiments, the power amplifier is further configured, in the receive mode of operation, to have an off-state impedance of at least 200+j*13 Ohm.

In some embodiments, the power amplifier, the low-noise amplifier, and the switching circuit are integrated into a single semiconductor die.

In some embodiments, the single semiconductor die is a CMOS die.

In accordance with another aspect, a front-end module is provided comprising an input port to receive an input radio frequency signal, a power amplifier module coupled to the input port to amplify the input radio frequency signal and provide a first radio frequency signal responsive to being enabled, an antenna port configured to be coupled to an antenna to receive a second radio frequency signal in a receive mode of operation and to transmit the first radio frequency signal from the power amplifier in a transmit mode of operation, a first balun coupled between the power amplifier module and the antenna port, a low-noise amplifier coupled to the antenna port to amplify the second radio frequency signal and provide the amplified second radio frequency signal to an output port, and a switching circuit disposed between the low-noise amplifier and the antenna port to selectively couple the low-noise amplifier to the antenna port to pass the second radio frequency signal from the antenna port to the low-noise amplifier. The switching circuit, the power amplifier module, the first balun, and the low-noise amplifier are integrated into a single semiconductor die.

In some embodiments, the front-end module further comprises a second balun coupled between the low-noise amplifier and the output port.

In some embodiments, the switching circuit, the power amplifier module, the first balun, the second balun, and the low-noise amplifier are integrated into the single semiconductor die, the single semiconductor die being a CMOS die.

In some embodiments, the power amplifier module includes a first power amplifier and a second power amplifier, the first balun coupled between the first power amplifier and the antenna, and the second balun coupled between the second power amplifier and the antenna.

In some embodiments, the power amplifier module and the first balun present an impedance of at least 200 Ohms responsive to the power amplifier module being disabled.

In some embodiments, the low-noise amplifier includes an input impedance matching network, and the switching circuit is implemented as part of the impedance matching network.

In some embodiments, the transmit signal has a frequency in a 34-36 GHz range and the power amplifier is further configured to amplify the transmit signal having a frequency in the 34-36 GHz range.

In accordance with another aspect, there is provided a multiple-input and multiple-output integrated circuit comprising an antenna to transmit a first radio frequency signal in a transmit mode of operation and to receive a second signal in a receive mode of operation, and a plurality of front-end modules coupled to the antenna. Each front-end module includes an input port to receive an input radio frequency signal, a power amplifier coupled to the input port to amplify the input radio frequency signal, to provide a first radio frequency signal responsive to being enabled, and to present an off-state impedance of at least 200 Ohms responsive to being disabled, a low-noise amplifier coupled to the antenna to amplify the second radio frequency signal from the antenna, a first balun coupled between the power amplifier and the antenna, and a switching circuit disposed between the low-noise amplifier and the antenna to selectively couple the low-noise amplifier to the antenna to pass the second radio frequency signal from the antenna to the low-noise amplifier. The switching circuit, the power amplifier, the first balun, and the low-noise amplifier are integrated into a single semiconductor die.

In some embodiments, the multiple-input and multiple-output integrated circuit further comprises a second balun coupled between the low-noise amplifier and an output port.

In some embodiments, the switching circuit, the power amplifier, the first balun, the second balun, and the low-noise amplifier are integrated into the single semiconductor die, the single semiconductor die being a CMOS die.

In some embodiments, the low noise amplifier includes an impedance matching network integrated into the single semiconductor die.

In some embodiments, the input radio frequency signal has a frequency in a 34-36 GHz range and the power amplifier is configured to amplify the input radio frequency signal having a frequency in the 34-36 GHz range.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
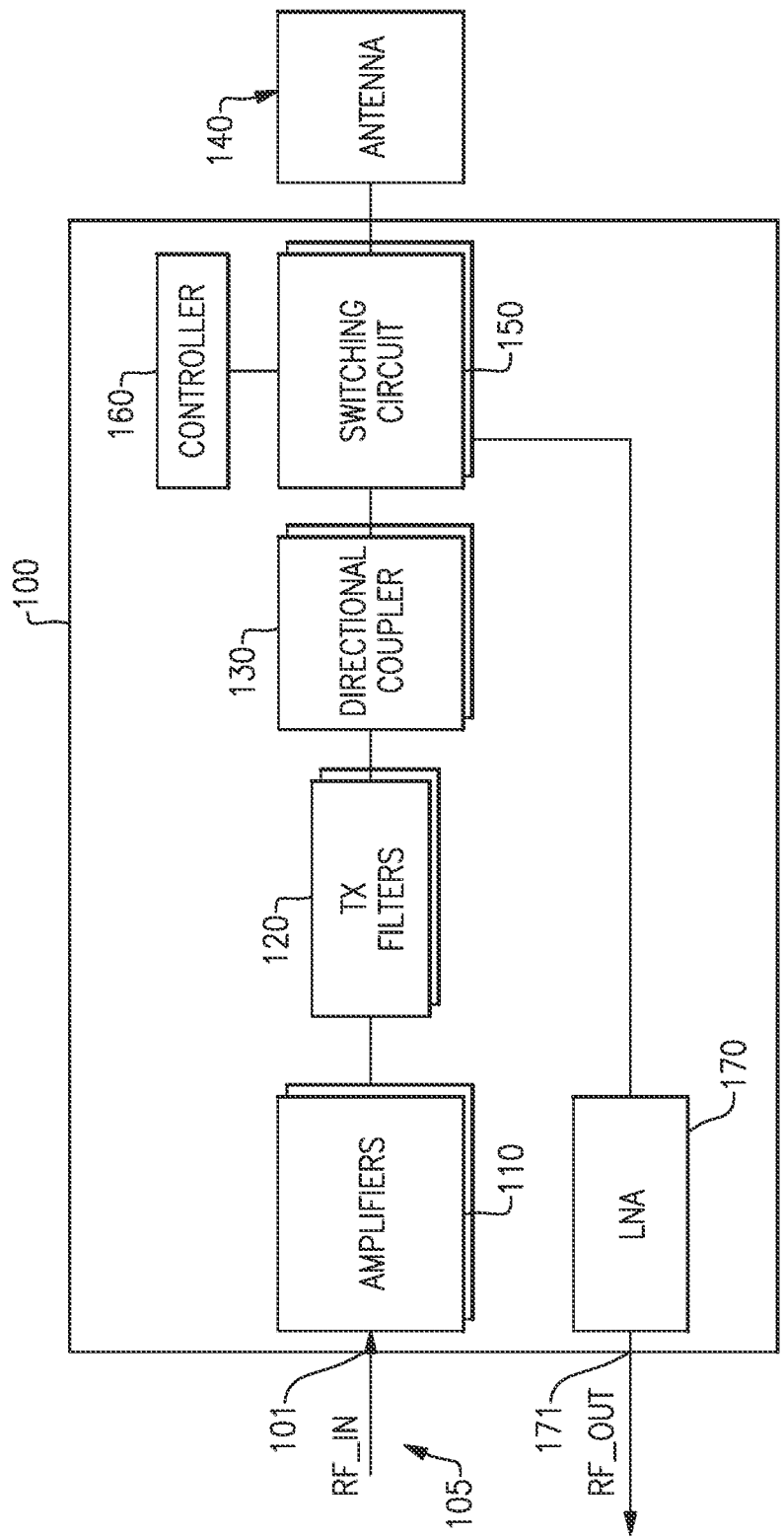
FIG. 1 is a block diagram of one example of a conventional RF front-end system.

As wireless technology advances, the operating frequency of radio systems typically increases, and the operating bandwidths of radio systems typically get wider due to the congestion in lower frequency bands and the increase in data rates. Consequently, it is generally desirable to achieve a high level of integration in a wireless communication device using CMOS technology. However, in conventional wireless communication devices, CMOS technology has not yet realized complete cellular radio integration because of challenges in power amplifiers and T/R switches (e.g., the T/R switch 210 shown in FIG. 2). For example, as shown in Table 1 below, as the operating frequency and bandwidth of a CMOS implemented radio system including the switching circuit 200 increase, the losses in the transmit path 202 due to the T/R switch 210 also increase.

TABLE 1

| 5G Backhaul for mini-Cell: TX Key | | | | | |
|---|---|---|---|---|---|
| Network | BW | Frequency | Modulations | RF Pout | TX Switch Loss |
| C Bank 6-13 GHz | N × 30 MHz | 6-13 GHz | >100 Mbs × N | Up to 32 dBm | 0.5~0.8 dB |
| Ku-K Band 15-23 GHz | | 15-23 Ghz | >100 Mbs × N | Up to 27 dBm | 0.8~1 dB |
| Ka Band 28 GHz | 1 GHZ | 28 GHz | 64 QAM Next 128 QAM | Up to 25 dBm | 1~2 dB |
| Q Band 40 GHz | 2 GHz | 39 GHz | 64 QAM Next 128 QAM | Up to 23 dBm | 2~2.5 dB |
| V Band 60 GHz | 9 GHz | 60 GHz | 16 QAM Next 64 QAM | Up to 10 dBm | 2.5~3.5 dB |
| E Band 71-86 GHz | 5 + 5 GHz | 71-76 GHz 81-86 GHz | 16 QAM Next 64 QAM | Up to 30 dBm | 3.5~5 dB |

Because of the anticipated losses in the transmit path 202 at high frequencies due to the T/R switch 210, conventional radio systems are typically designed to provide output power from the PA 206 that is 1-2 dB higher than that presented to the antenna 212. This is generally undesirable as it can lead to wasted energy. In addition, because of the position of the T/R switch 210 within both the transmit and receive paths, there are linearity and maximum power constraints in a conventional radio system including the switching circuit 200.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 2:
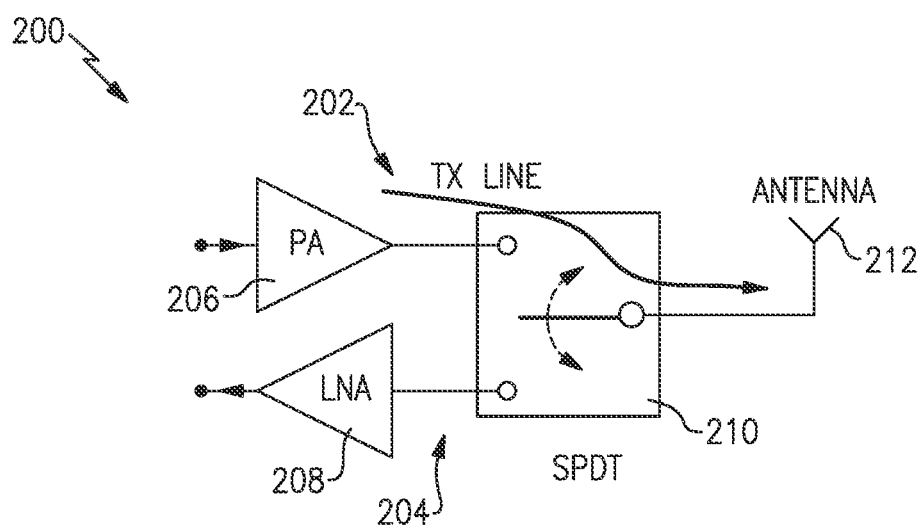
FIG. 2 is a schematic representation of a conventional switching circuit.

As discussed above, in communication devices, and particularly in the front-end architecture of the transmit chain in communication devices, it is common to include a switching circuit to switch between a transmitting mode and a receiving mode. FIG. 2 is a simplified schematic diagram of a conventional switching circuit 200 including a transmit path 202 and a receive path 204. The transmit path 202 includes a power amplifier 206 and the receive path 204 includes a Low-Noise Amplifier (LNA) 208. A T/R switch 210 is configured to selectively couple either the PA 206 of the transmit path 202 to the antenna 212 or the LNA 208 of the receive path 204 to the antenna 212. In at least one embodiment, the T/R switch 210 is a Single-Pole, Double Throw (SPDT) switch.

Figure 3A:
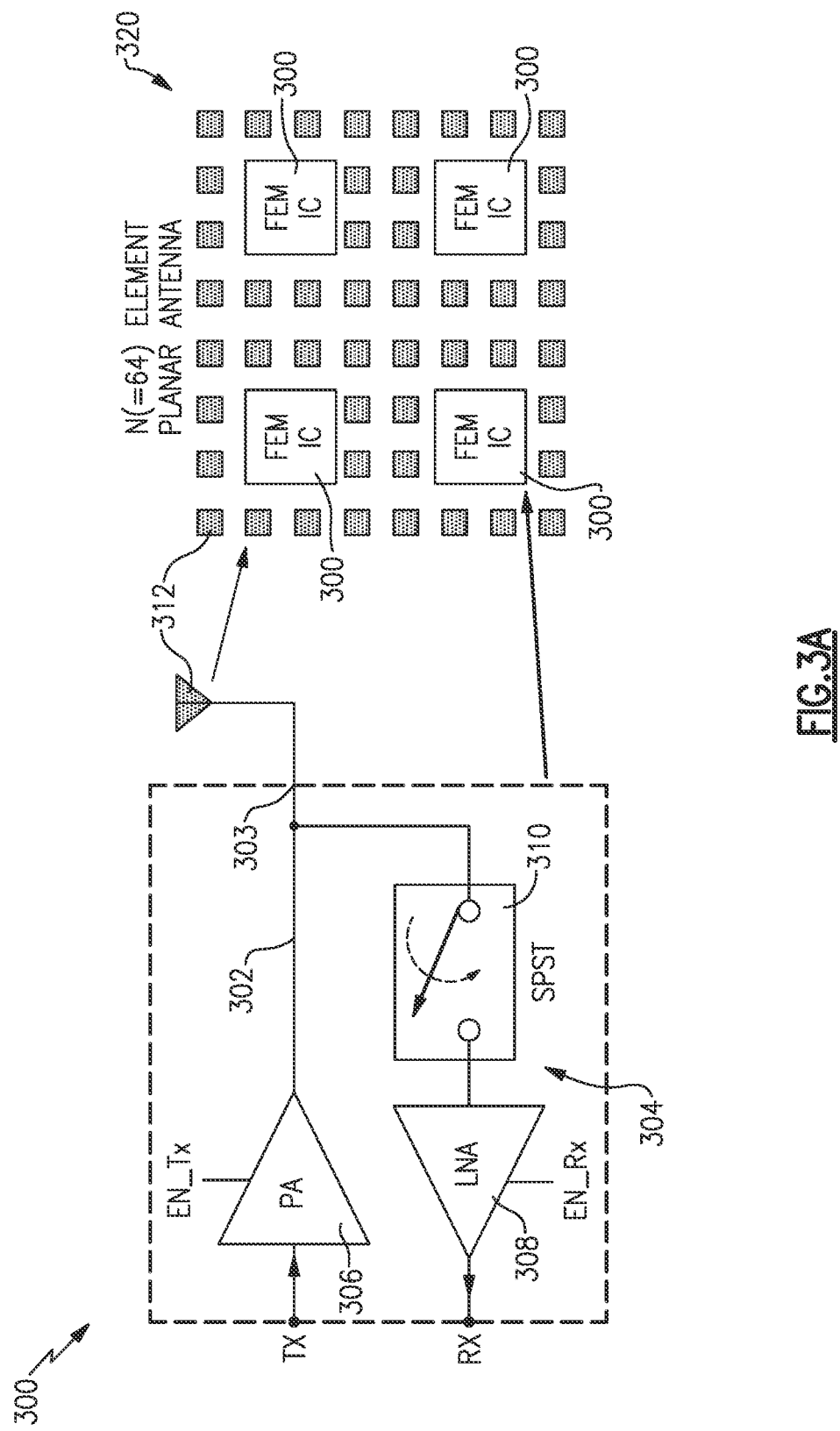
FIG. 3A is a block diagram including a switching circuit according to aspects of the present invention.

A new switching circuit is described herein that reduces switching losses in the transmit path to the antenna by removing the switch from the transmit path. For example, one embodiment of the new switching circuit 310 is shown in FIG. 3A. FIG. 3A includes a block diagram of a FEM 300. For illustrative purposes, the FEM 300 of FIG. 3A is a simplified block diagram and the FEM 300 can include additional components. For example, in at least one embodiment, the FEM 300 is the same as the FEM 100 shown in FIG. 1, except for the replacement of the switching circuit 150 with the switching circuit 310.

The FEM 300 includes a transmit path 302 and a receive path 304. The transmit path 302 is coupled between a power amplifier 306 and an output 303 of the FEM 300. The receive path 304 is coupled between an LNA 308 and the output 303 and includes the switching circuit 310. The switching circuit 310 is configured to selectively couple the LNA 308 of the receive path 304 to the antenna 312, via the output 303. According to at least one embodiment, the switching circuit 310 is a Single-Pole, Single-Throw (SPST) switch; however, in other embodiments, a different type of switch may be utilized.

When transmission of an amplified RF signal (from the PA 306) is desired, a controller of the FEM 300 (e.g., similar to the controller 160 of the FEM 100) operates the FEM 300 (e.g., via an EN_Tx control signal) to operate in a transmit mode. In the transmit mode, the switching circuit 310 is controlled to open and the PA 306 is operated to provide an amplified RF signal directly to the antenna 312 via the output 303, bypassing the receive path 304 (and the switching circuit 310). When reception of an RF signal is desired, the controller of the FEM 300 (e.g., similar to the controller 160 of the FEM 100) operates the FEM 300 (e.g., via an EN_Rx control signal) to operate in a receive mode. In the receive mode, the switching circuit 310 is controlled to close, coupling the LNA 308 to the antenna 312 via the output 303, and the LNA 308 is operated to amplify the received RF signal from the antenna 312.

TABLE 2

| Control Signals and Operational Modes of FEM 300 | | |
|---|---|---|
| EN_Tx | EN_Rx | Operation-Mode |
| 0 | 0 | All Disabled |
| 0 | 1 | Rx ON |
| 1 | 0 | Tx ON |
| 1 | 1 | Calibration |

Table 2, shown above, illustrates the different modes of operation, and corresponding control signals, of the FEM 300. For example, as shown in Table 2, when the FEM 300 is off and no transmission or reception of signals is desired, a low transmit enable control signal (EN_Tx) is provided to the PA 306 to turn off the PA 306 and a low receive enable control signal (EN_Rx) is provided to the LNA 308 to turn off the LNA 308. When transmission of a signal by the FEM 300 is desired (i.e., a transmit mode of operation), a high transmit enable control signal (EN_Tx) is provided to the PA 306 to turn on the PA 306 and a low receive enable control signal (EN_Rx) is provided to the LNA 308 to turn off the LNA 308. Also, as discussed above, in a transmit mode of operation, the switching circuit 310 is controlled to open and the PA 306 is operated to provide an amplified RF signal directly to the antenna 312 via the output 303, bypassing the receive path 304 (and the switching circuit 310). When reception of a signal by the FEM 300 is desired (i.e., a receive mode of operation), a low transmit enable control signal (EN_Tx) is provided to the PA 306 to turn off the PA 306 and a high receive enable control signal (EN_Rx) is provided to the LNA 308 to turn on the LNA 308. As discussed above, also in a receive mode of operation, the switching circuit 310 is controlled to close, coupling the LNA 308 to the antenna 312 via the output 303, and the LNA 308 is operated to amplify a received RF signal from the antenna 312. According to a least one embodiment, the FEM 300 can also be operated in an observation loop in a calibration mode of operation. For example, in the calibration mode, a high transmit enable control signal (EN_Tx) is provided to the PA 306 to turn on the PA 306 and a high receive enable control signal (EN_Rx) is provided to the LNA 308 to turn on the LNA 308. While both the PA 306 and the LNA 308 are on, a user can calibrate the FEM 300 through operation of the loop formed by the PA 306 and LNA 308.

According to at least one embodiment, the FEM 300 is typically operated in the receive mode of operation with the switching circuit 310 closed, such that any signal received by the antenna 312 is passed to the LNA 308. In at least one embodiment, when transmission of a signal is desired by the FEM 300, the switching circuit 310 is opened. After the switching circuit 310 is opened, the PA 306 is enabled with the transmit enable control signal (EN_Tx). After the PA 306 is enabled, the LNA 308 is disabled with the receive enable control signal (EN_Rx). After the LNA 308 is disabled, the PA 306 is operated to provide an amplified RF signal directly to the antenna 312 via the output 303, bypassing the receive path 304 (and the switching circuit 310). In at least one other embodiment, the LNA 308 can be disabled prior to enabling the PA 306

In at least one embodiment, once transmission by the PA 306 is completed, the PA 306 is disabled with the transmit enable control signal (EN_Tx). After the PA 306 is disabled, the switching circuit 310 is closed. After the switching circuit 310 is closed, the LNA 308 is enabled with the receive enable control signal (EN_Rx). According to other embodiments, operation of the FEM 300 during transition between transit and receive mode of operation may be configured differently.

According to at least one embodiment, the switching circuit 310 is implemented by a switch of the LNA 308 (e.g., within LNA matching circuitry). By implementing the switching circuit 310 with the LNA 308, greater integration of components in the FEM 300 can be achieved resulting in reduced cost.

By bypassing the receive path 304 and the switching circuit 310 in the transmit mode, losses in the transmit path 306 between the PA 306 and the antenna 312 are reduced. For example, in at least one embodiment of the transmit mode, due to the low losses in the transmit path, output power received by the antenna 312 is only 0.001 dBm less than the power output by the PA 306. In addition, by bypassing the receive path 304 and switching circuit 310, the maximum power transmitted via the transmit path 306 increases and the linearity constraints typically found in a transmit path (e.g., as discussed above with respect to FIG. 2) are removed.

Figure 3B:
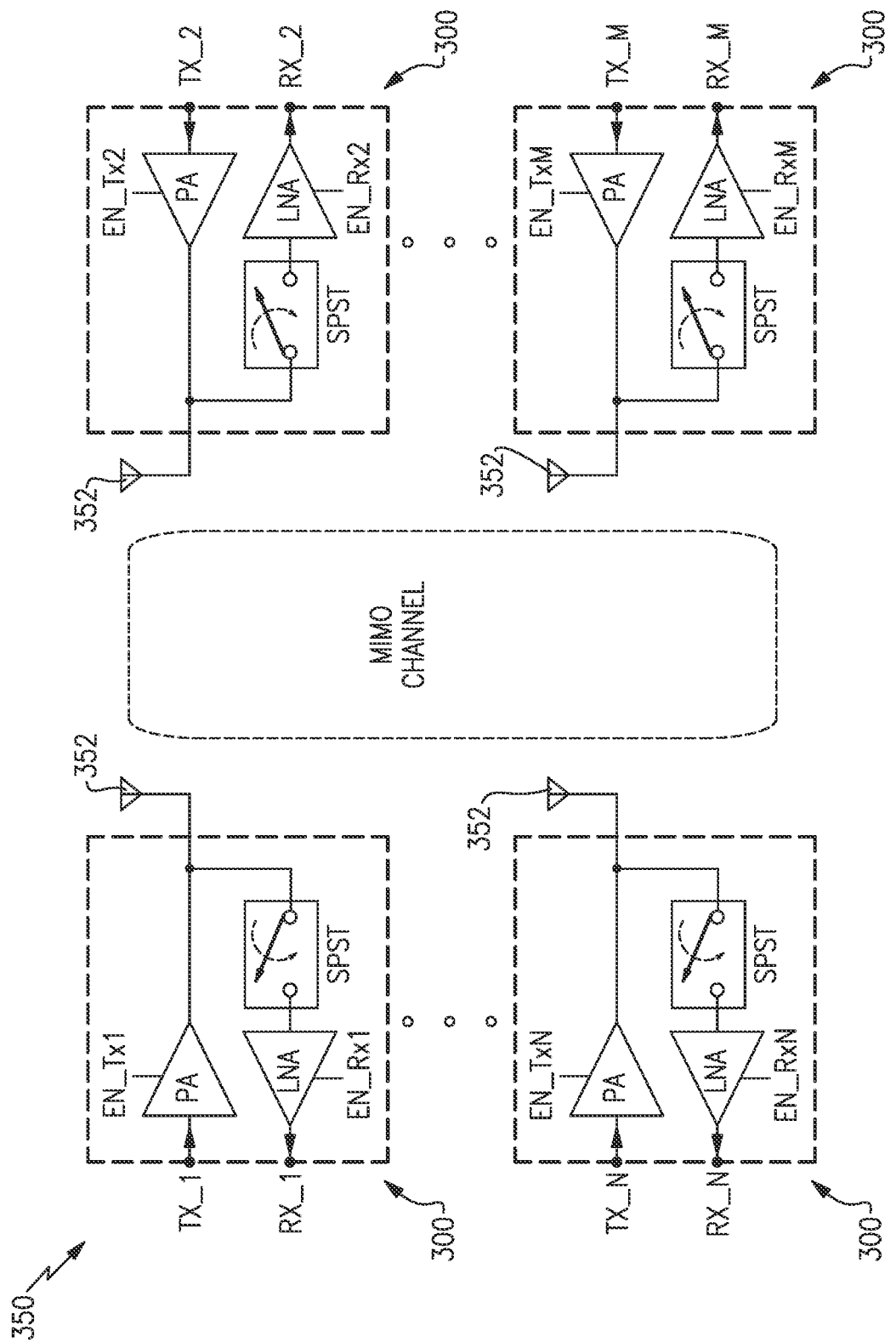
FIG. 3B is a schematic representation of a MIMO system according to aspects of the present invention.

With the advent of large multiple-input and multiple-output (MIMO) systems for 5G systems, individual module antennas can be replaced with an antenna array with, for example, 64 array elements, that is coupled to multiple front-end modules. For example, as also shown in FIG. 3A, multiple FEMs 300, each including a switching circuit 310, can be implemented on the die of an Integrated Circuit (IC) 320 in conjunction with the single antenna 312. As shown in FIG. 3A, the antenna 312 is a multi-element (e.g., 64 element) planar antenna array; however, in other embodiments, different types of antennas may be utilized. FIG. 3B further illustrates one embodiment of a MIMO system 350 within which multiple FEMs 300 can be incorporated. Each FEM can receive and transmit information via the same antenna array 352. The MIMO system of FIG. 3B can include any number of FEMs 300.

In at least one embodiment of the FEM 300 described above, the FEM 300 is designed such that the PA 306 in the transmit path 302 has a relatively high off-state impedance. In one embodiment, the off-state impedance of the PA 306 is greater than 200 ohms. In another embodiment, the off-state impedance of the PA 306 is greater than 250 ohms. In another embodiment, the PA is configured to have an off-state impedance of about 200+j*13 Ohm (where j is the imaginary unit). In another embodiment, the PA 306 is configured to have an off-state impedance of at least 200+ j*13 Ohm. In other embodiments, the PA 306 may be configured to have another appropriate off-state impedance level. By configuring the PA 306 to have a relatively high off-state impedance, impact by the PA 306 on the LNA 308 or switching circuit 310 in the receive mode of operation due to the handling of high frequency signals (e.g., 5G cellular signals in the 6-GHz to 100-GHz range) can be minimized. Absent such a high off-state impedance, high frequency signals handled by the FEM may cause the impedance of the PA to lower such that a resulting noise factor seen in the receive path (e.g., by the LNA) in the receive mode of operation increases to undesired levels.

Figure 4:
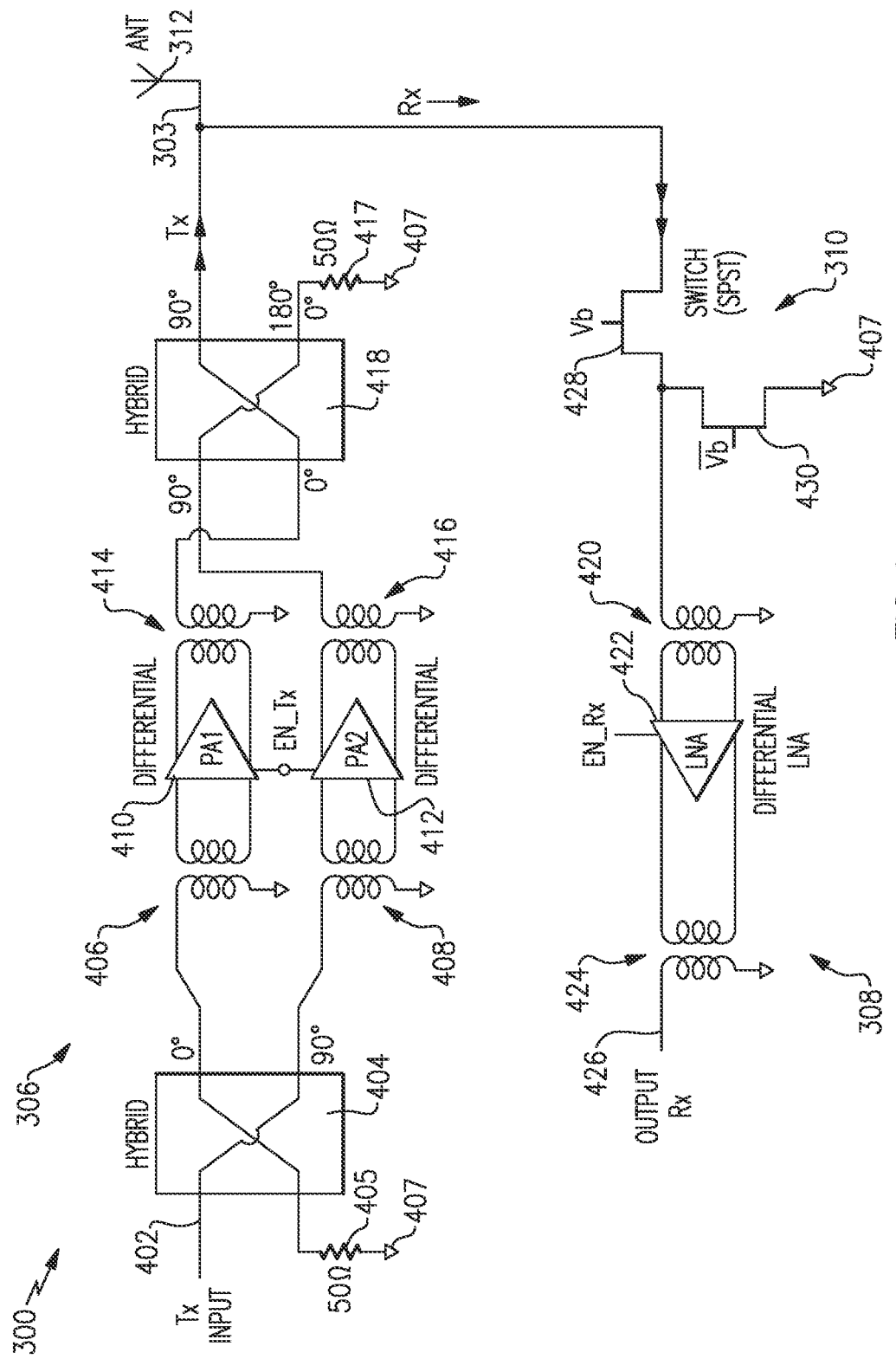
FIG. 4 is a schematic representation of an RF front-end system according to aspects of the present invention.

FIG. 4 is a schematic diagram of one embodiment of the FEM 300 where the PA 306 is configured to have a relatively high off-state impedance (e.g., 200+j*13 Ohm). As shown in FIG. 4, the PA 306 is configured as a balanced amplifier and includes a first 90° hybrid circuit 404 (i.e., a first phase shifter circuit), a first balun 406, a second balun 408, a first differential amplifier 410, a second differential amplifier 412, a third balun 414, a fourth balun 416, and a second 90° hybrid circuit 418 (i.e., a second phase shifter circuit). An input 402 of the PA 306 is coupled to the first 90° hybrid circuit 404. The first 90° hybrid circuit is also coupled to the first balun 406 and the second balun 408. The first 90° hybrid circuit is also coupled to ground 407 via a first resistor 405. The first balun 406 is also coupled to the input terminals of the first differential amplifier 410. The second balun 408 is also coupled to the input terminals of the second differential amplifier 412. An output of the first differential amplifier 410 is coupled to the third balun 414. An output of the second differential amplifier 412 is coupled to the fourth balun 416. The third balun 414 and the fourth balun 416 are also coupled to the second 90° hybrid circuit 418. The second 90° hybrid circuit 418 is also coupled to ground 407 (via a second resistor 417) and to the output 303 of the FEM 300.

As further shown in FIG. 4, the LNA 308 includes a fifth balun 420, a third differential amplifier 422, and a sixth balun 424. The fifth balun 420 is coupled between the switching circuit 310 and the input terminals of the third differential amplifier 422. The sixth balun 424 is coupled between the output of the third differential amplifier 422 and an output 426 of the LNA 308. As additionally shown in FIG. 4, the switching circuit 310 includes a first switch 428 coupled between the fifth balun 420 and the output 303 of the FEM 300. The switching circuit 310 further includes a second switch 430 coupled between the fifth balun 420 and ground 407.

As similarly discussed above, when transmission of an amplified RF signal (from the PA 306) by the FEM 300 is desired, the controller of the FEM 300 (e.g., similar to the controller 160 of the FEM 100) operates the FEM 300 to operate in a transmit mode. In the transmit mode, the controller operates the first switch 428 of the switching circuit 310 to open and the second switch 430 of the switching circuit 310 to close, thereby decoupling the LNA 308 from the output 303. The controller also disables the LNA 422 via the EN_Rx control signal, as discussed above.

Also in the transmit mode, an input RF signal is provided to the first 90° hybrid circuit 404 and the first 90° hybrid circuit 404 operates to split the input RF signal into a first signal, provided to the first balun 406, and a second signal, provided to the second balun 408. The first 90° hybrid circuit 404 generates the first and second signals such that the second signal is 90° out of phase with the first signal. For example, the first signal may have the same phase as the input RF signal and the second signal may be shifted by 90 degrees relative to the input RF signal (and the first signal). Depending on the winding ratio of the first balun 406, the first balun 406 operates to provide a first amplifier input signal, corresponding to the first signal, to the input terminals of the first differential amplifier 410. Depending on the winding ratio of the second balun 408, the second balun 408 operates to provide a second amplifier input signal, corresponding to the second signal, to the input terminals of the second differential amplifier 412.

In the transmit mode, the controller enables the first and second differential amplifiers 410, 412 with the EN_Tx control signal, as discussed above, and operates the first amplifier 410 to amplify the first amplifier input signal at a first gain to produce a first gain adjusted signal which is provided to the third balun 414, and operates the second amplifier 412 to amplify the second amplifier input signal at a second gain to produce a second gain adjusted signal which is provided to the fourth balun 416. Depending on the winding ratio of the third balun 414, the third balun 414 operates to provide a first amplifier output signal, corresponding to the first gain adjusted signal, to the second 90° hybrid circuit 418. Depending on the winding ratio of the fourth balun 416, the fourth balun 416 operates to provide a second amplifier output signal, corresponding to the second gain adjusted signal, to the second 90° hybrid circuit 418.

The second 90° hybrid circuit 418 applies a 90 degree phase shift to one of the first and second amplifier output signals, combines the first and second amplifier output signals from the third balun 414 and the fourth balun 416, and provides a resulting output RF signal to the output 303, the output RF signal bypassing the switching circuit 310.

As similarly discussed above, when reception of an RF signal (by the LNA 308) with the FEM 300 is desired, the controller of the FEM 300 (e.g., similar to the controller 160 of the FEM 100) operates the FEM 300 to operate in a receive mode. In the receive mode, the controller operates the first switch 428 of the switching circuit 310 to close and the second switch 430 of the switching circuit 310 to open, thereby coupling the LNA 308 to the output 303. The controller also disables the PA 306 via the EN_Rx control signal, as discussed above.

Also in the receive mode, an RF signal received by the antenna 312 is provided, via the switching circuit 310, to the fifth balun 420. Depending on the winding ratio of the fifth balun 420, the fifth balun 420 operates to provide a third amplifier input signal, corresponding to the RF signal received by the antenna 312, to the input terminals of the third differential amplifier 422. In the receive mode, the controller enables the third differential amplifiers 422 with the EN_Rx control signal, as discussed above, and operates the third amplifier 422 to amplify the third amplifier input signal at a third gain to produce a third gain adjusted signal which is provided to the sixth balun 424. Depending on the winding ratio of the sixth balun 424, the sixth balun 424 operates to provide a third amplifier output signal, corresponding to the third gain adjusted signal, to the output 426.

While receiving high frequency signals (e.g., 5G cellular signals in the 6-GHz to 100-GHz range) in the receive mode, the relatively high off-state impedance of the PNA 306 (e.g., 200+j*13 Ohm), due to the 90° hybrid circuits, baluns, and differential amplifiers, minimizes the noise factor impact by the PA 306 on the LNA 308 or switching circuit 310. In one embodiment, the FEM 300 is configured to be operated in a millimeter wave radio system that transmits and receives millimeter wave signals in a 30-100 GHz frequency range. In one embodiment, the FEM 300 is configured to operate on signals in a 34-36 GHz frequency range. In other embodiments, the FEM 300 can be operated in a system transmitting and receiving signals at another appropriate frequency.

Due to the relatively high frequency at which the FEM 300 is operated, according to at least one embodiment, the size of at least some of the components of the FEM 300 can be reduced such that the entire FEM 300 is implemented on a single die of an integrated circuit. For example, in at least one embodiment, each winding/coil of each balun in the FEM 300 can be configured to have an impedance of about 300 picohenries; however, in other embodiments, the impedance of each balun can be configured to another appropriate level such that the FEM 300 can be integrated on a single die. Other components of the FEM 300 can similarly be limited in size to fit the FEM 300 on a single die.

Embodiments of the switching circuit 310 disclosed herein, packaged into an FEM (e.g., the FEM 100 or FEM 300 discussed above with respect to FIGS. 1 and 3), may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), an appliance, such as a microwave, refrigerator, or other appliance, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a wrist watch, a clock, etc. Further, the electronic devices can include unfinished products.

Figure 5A:
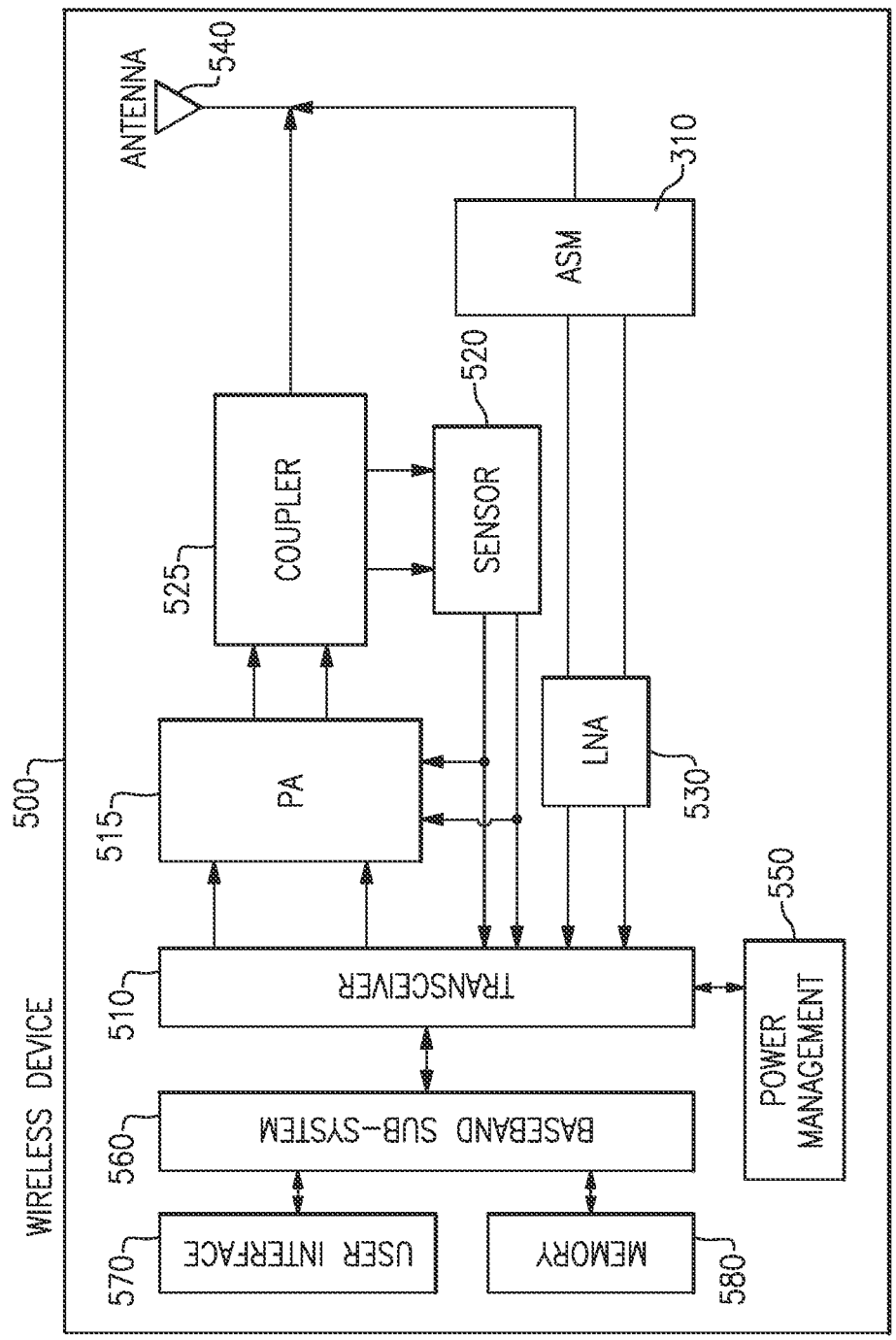
FIG. 5A is a block diagram of one example of a wireless device including a switching circuit according to aspects of the present invention.

FIG. 5A is a block diagram of one embodiment of a wireless device 500 in which the switching circuit 310 (which can also be referred to as an antenna switch module (ASM)) can be implemented. The wireless device 500 can be a cellular phone, smart phone, tablet, modem, communication network or any other portable or non-portable device configured for voice and/or data communication. The wireless device 500 can receive and transmit signals from the antenna 540. The wireless device 500 includes a transceiver 510 that is configured to generate signals for transmission and/or to process received signals. In some embodiments, transmission and reception functionalities can be implemented in separate components (e.g. a transmit module and a receiving module) or be implemented in the same module.

Signals generated for transmission are received by the power amplifier (PA) module 515, which amplifies the generated signals from the transceiver 510. As will be appreciated by those skilled in the art, the power amplifier module 515 can include one or more power amplifiers. The power amplifier module 515 can be used to amplify a wide variety of RF or other frequency-band transmission signals. For example, the power amplifier module 515 can receive an enable signal that can be used to pulse the output of the power amplifier to aid in transmitting a wireless local area network (WLAN) signal or any other suitable pulsed signal. The power amplifier module 515 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 515 and associated components including switches and the like can be fabricated on GaAs substrates using, for example, pHEMT or BiFET transistors, or on a Silicon substrate using CMOS transistors. The wireless device 500 also includes an LNA module 530, which may include one or more low noise amplifiers configured to amplify received signals.

The wireless device 500 also includes the coupler 525 having one or more coupler sections for measuring transmitted power signals from the power amplifier module 515 and for providing one or more coupled signals to a sensor module 520. The sensor module 520 can in turn send information to the transceiver 510 and/or directly to the power amplifier module 515 as feedback for making adjustments to regulate the power level of the power amplifier module 515. In this way the coupler 525 can be used to boost/decrease the power of a transmission signal having a relatively low/high power. It will be appreciated, however, that the coupler 525 can be used in a variety of other implementations.

For example, in certain embodiments in which the wireless device 500 is a mobile phone having a time division multiple access (TDMA) architecture, the coupler 525 can advantageously manage the amplification of an RF transmitted power signal from the power amplifier module 515. In a mobile phone having a time division multiple access (TDMA) architecture, such as those found in Global System for Mobile Communications (GSM), code division multiple access (CDMA), and wideband code division multiple access (W-CDMA) systems, the power amplifier module 515 can be used to shift power envelopes up and down within prescribed limits of power versus time. For instance, a particular mobile phone can be assigned a transmission time slot for a particular frequency channel. In this case the power amplifier module 515 can be employed to aid in regulating the power level one or more RF power signals over time, so as to prevent signal interference from transmission during an assigned receive time slot and to reduce power consumption. In such systems, the coupler 525 can be used to measure the power of a power amplifier output signal to aid in controlling the power amplifier module 515, as discussed above. The implementations shown in FIG. 5A is exemplary and non-limiting. For example, the implementation of FIG. 5A illustrates the coupler 525 being used in conjunction with a transmission of an RF signal, however, it will be appreciated that various examples of the coupler 525 discussed herein can also be used with received RF signals or other signals as well.

The wireless device 500 also includes the switching circuit 310 (which may also be called an ASM), which is configured to switch between different bands and/or modes. As discussed above with respect to FIG. 3, the switching circuit 310 is configured to couple the LNA 530 to the antenna 540 in a receive mode of operation and to decouple the LNA 530 from the antenna 540 in a transmit mode of operation. As also discussed above, the PA 515 is coupled to the antenna 540 such that signals provided to the antenna 540 from the PA 515 in the transmit mode of operation bypass the receive path (and switching circuit 310) of the device 500. By bypassing the switching circuit 310 in the transmit mode of operation, losses in the transmit path between the power amplifier module 515 and the antenna 540 are reduced.

As shown in FIG. 5A, in certain embodiments the antenna 540 can both receive signals that are provided to the transceiver 510 via the switching circuit 310 and the LNA 530 and also transmit signals from the wireless device 500 via the transceiver 510, the power amplifier module 515, and the coupler 525. However, in other examples multiple antennas can be used for different modes of operation.

In the example illustrated in FIG. 5A, the coupler 525 is shown positioned between the power amplifier module 515 and the antenna 540. However, as discussed above, the coupler 525 can be connected at various locations along transmit or receive signal path(s). Further, in the example shown in FIG. 5A, the coupler 525 is shown as an individual component; however, in other examples, the coupler 525 can be combined with one or more other components of the wireless device 500. For example, in at least one embodiment, the wireless device 500 includes an integrated filter-coupler that combines the functionality of the coupler 525 and a filter. The wireless device 500 can include any number of filters which can be connected at various locations along transmit or receive signal path(s). Given the benefit of this disclosure, those skilled in the art will appreciate that a variety of other configurations and combinations of the components of the wireless device 500 may be implemented.

The wireless device 500 of FIG. 5A further includes a power management system 550 that is connected to the transceiver 510 and that manages the power for the operation of the wireless device 500. The power management system 550 can also control the operation of a baseband sub-system 560 and other components of the wireless device 500. The power management system 550 can include, or can be connected to, a battery that supplies power for the various components of the wireless device 500. The power management system 550 can further include one or more processors or controllers that can control the transmission of signals and can also configure the coupler 525 based upon the frequency of the signals being transmitted, for example. In addition, the processor(s) or controller(s) of the power management system 550 may provide control signals to actuate switches, tune elements, or otherwise configure the coupler 525. In at least one embodiment, the processor(s) or controller(s) of the power management system 550 can also provide control signals to control the switching circuit 310 to operate in the transmit or receive mode.

In one embodiment, the baseband sub-system 560 is connected to a user interface 570 to facilitate various input and output of voice and/or data provided to and received from the user. The baseband sub-system 560 can also be connected to memory 580 that is configured to store data and/or instructions to facilitate the operation of the wireless device, and/or to provide storage of information for the user.

Figure 5B:
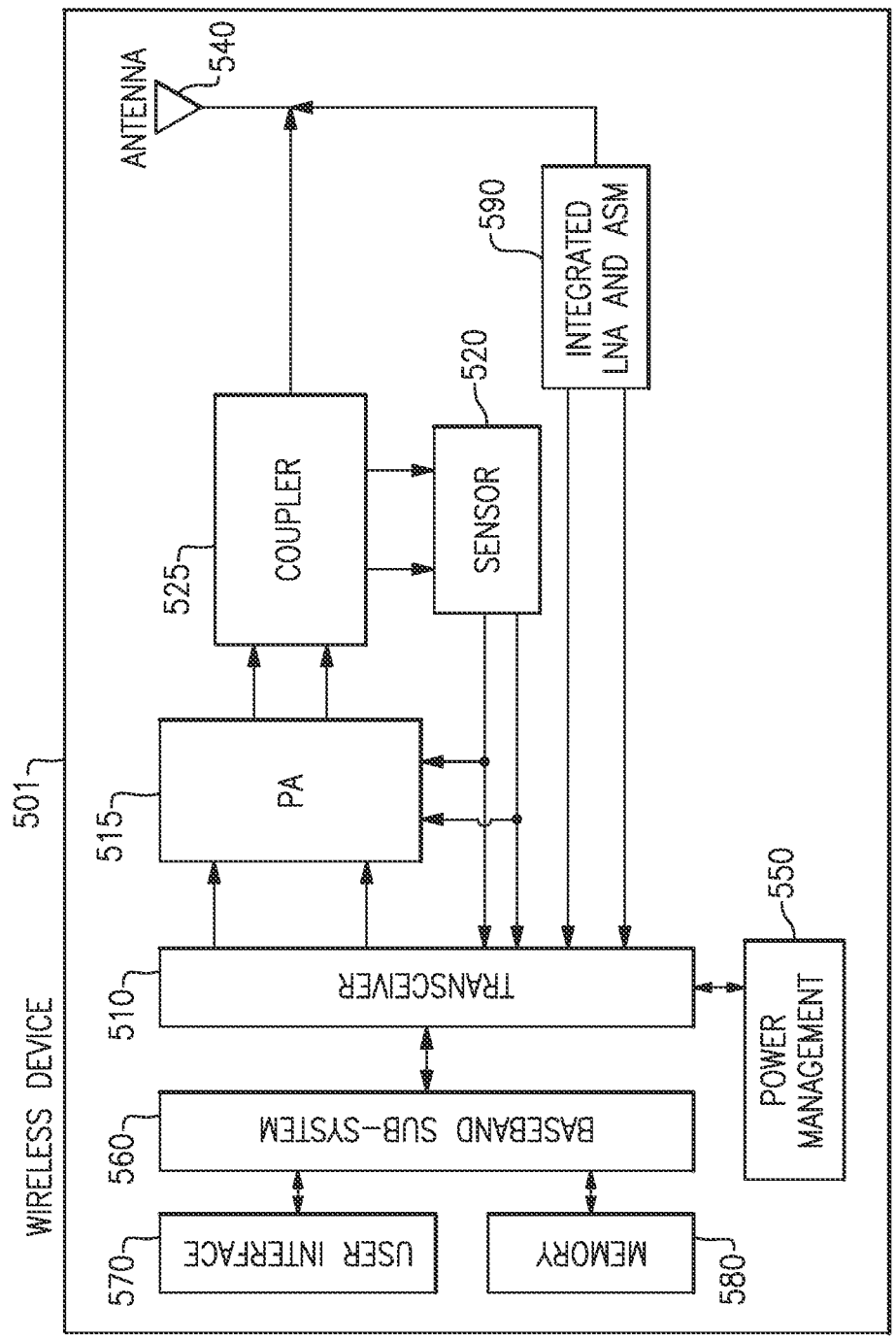
FIG. 5B is a block diagram of another example of a wireless device including an integrated LNA and switching circuit according to aspects of the present invention.

FIG. 5B is a block diagram of another embodiment of a wireless device 501 in which the switching circuit 310 (which can also be referred to as an antenna switch module (ASM)) can be implemented. The wireless device 501 is the same as the wireless device 500 discussed above with respect to FIG. 5A, except that in the wireless device 501, the LNA 530 and the switching circuit 310 are integrated in a single module 590. For example, in one embodiment, the LNA 530 may include an input impedance matching network, and the switching circuit 310 may be implemented as part of the impedance matching network of the LNA in a single integrated circuit (i.e., the single module 590).

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A front-end module for a wireless device comprising:
an input port to receive an input radio frequency signal;
a power amplifier coupled to the input port to amplify the input radio frequency signal and provide a first radio frequency signal responsive to being enabled, and to present an off-state impedance of at least 200 Ohms responsive to being disabled;
an antenna port configured to be coupled to an antenna, to receive a second radio frequency signal from the antenna in a receive mode of operation and to transmit the first radio frequency signal from the power amplifier to the antenna in a transmit mode of operation;
a low-noise amplifier coupled to the antenna port to amplify the second radio frequency signal and provide the amplified second radio frequency signal to an output port;
a switching circuit disposed between the low-noise amplifier and the antenna port to selectively couple the low-noise amplifier to the antenna port; and
a controller coupled to the switching circuit, the power amplifier, and the low-noise amplifier, the controller being configured to cause the switching circuit to close and to disable the power amplifier in the receive mode of operation, and to cause the switching circuit to open in the transmit mode of operation.

2. The front-end module of claim 1 wherein the controller is further configured, in the receive mode of operation, to transmit an enable control signal to the low-noise amplifier and a disable control signal to the power amplifier.

3. The front-end module of claim 1 wherein the controller is further configured, in the transmit mode of operation, to transmit an enable control signal to the power amplifier and a disable control signal to the low-noise amplifier.

4. The front-end module of claim 1 wherein the controller is further configured, in the transmit mode of operation, to transmit an enable control signal to the power amplifier in response to the switching circuit opening and to transmit a disable control signal to the low-noise amplifier in response to the power amplifier being enabled.

5. The front-end module of claim 1 wherein the controller is further configured, in the receive mode of operation, to:
transmit a disable control signal to the power amplifier;
cause the switching circuit to close in response to the power amplifier being disabled; and
transmit an enable control signal to the low-noise amplifier in response to the switching circuit closing.

6. The front-end module of claim 1 wherein the low-noise amplifier includes a differential amplifier, a first balun coupled between the differential amplifier and the switching circuit, and a second balun coupled between the differential amplifier and the output port.

7. The front-end module of claim 1 wherein the input radio frequency signal has a frequency in a 34-36 GHz range and the power amplifier is further configured to amplify the input RF signal having a frequency in the 34-36 GHz range.

8. The front-end module of claim 1 wherein the power amplifier is further configured, in the receive mode of operation, to have an off-state impedance of at least 200+ j*13 Ohm.

9. The front-end module of claim 1 wherein the power amplifier, the low-noise amplifier, and the switching circuit are integrated into a single semiconductor die.

10. The front-end module of claim 9, where the single semiconductor die is a CMOS die.

11. A front-end module comprising:
an input port to receive an input radio frequency signal;
a power amplifier module coupled to the input port to amplify the input radio frequency signal and provide a first radio frequency signal responsive to being enabled;
an antenna port configured to be coupled to an antenna to receive a second radio frequency signal in a receive mode of operation and to transmit the first radio frequency signal from the power amplifier in a transmit mode of operation;
a first balun coupled between the power amplifier module and the antenna port;
a low-noise amplifier coupled to the antenna port to amplify the second radio frequency signal and provide the amplified second radio frequency signal to an output port; and
a switching circuit disposed between the low-noise amplifier and the antenna port to selectively couple the low-noise amplifier to the antenna port to pass the second radio frequency signal from the antenna port to the low-noise amplifier, the switching circuit, the power amplifier module, the first balun, and the low-noise amplifier being integrated into a single semiconductor die.

12. The front-end module of claim 11 further comprising a second balun coupled between the low-noise amplifier and the output port.

13. The front-end module of claim 12 wherein the switching circuit, the power amplifier module, the first balun, the second balun, and the low-noise amplifier are integrated into the single semiconductor die, the single semiconductor die being a CMOS die.

14. The front-end module of claim 12 wherein the power amplifier module includes a first power amplifier and a second power amplifier, the first balun coupled between the first power amplifier and the antenna, and the second balun coupled between the second power amplifier and the antenna.

15. The front-end module of claim 11 wherein the power amplifier module and the first balun present an impedance of at least 200 Ohms responsive to the power amplifier module being disabled.

16. The front-end module of claim 11 wherein the low-noise amplifier includes an input impedance matching network, and the switching circuit is implemented as part of the impedance matching network.

17. The front-end module of claim 11 wherein the transmit signal has a frequency in a 34-36 GHz range and the power amplifier is further configured to amplify the transmit signal having a frequency in the 34-36 GHz range.

18. A multiple-input and multiple-output integrated circuit comprising:
an antenna to transmit a first radio frequency signal in a transmit mode of operation and to receive a second signal in a receive mode of operation; and
a plurality of front-end modules coupled to the antenna, each front-end module including:
an input port to receive an input radio frequency signal;
a power amplifier coupled to the input port to amplify the input radio frequency signal, to provide a first radio frequency signal responsive to being enabled, and to present an off-state impedance of at least 200 Ohms responsive to being disabled;
a low-noise amplifier coupled to the antenna to amplify the second radio frequency signal from the antenna;
a first balun coupled between the power amplifier and the antenna; and
a switching circuit disposed between the low-noise amplifier and the antenna to selectively couple the low-noise amplifier to the antenna to pass the second radio frequency signal from the antenna to the low-noise amplifier, the switching circuit, the power amplifier, the first balun, and the low-noise amplifier being integrated into a single semiconductor die.

19. The multiple-input and multiple-output integrated circuit of claim 18 further comprising a second balun coupled between the low-noise amplifier and an output port.

20. The multiple-input and multiple-output integrated circuit of claim 19 wherein the switching circuit, the power amplifier, the first balun, the second balun, and the low-noise amplifier are integrated into the single semiconductor die, the single semiconductor die being a CMOS die.

21. The multiple-input and multiple-output integrated circuit of claim 18 wherein the low noise amplifier includes an impedance matching network integrated into the single semiconductor die.

22. The multiple-input and multiple-output integrated circuit of claim 18 wherein the input radio frequency signal has a frequency in a 34-36 GHz range and the power amplifier is configured to amplify the input radio frequency signal having a frequency in the 34-36 GHz range.

* * * * *